(12) United States Patent
Takahashi

(10) Patent No.: US 6,651,205 B2
(45) Date of Patent: Nov. 18, 2003

(54) TEST PATTERN CONVERSION APPARATUS AND CONVERSION METHOD

(75) Inventor: Koji Takahashi, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 404 days.

(21) Appl. No.: 09/776,422

(22) Filed: Feb. 2, 2001

(65) Prior Publication Data
US 2002/0108079 A1 Aug. 8, 2002

(51) Int. Cl.⁷ .............................................. G01R 31/28
(52) U.S. Cl. ...................................................... 714/738
(58) Field of Search ............................... 714/738, 724, 714/741; 327/100; 708/250; 324/73.1

(56) References Cited

U.S. PATENT DOCUMENTS

| | | | | |
|---|---|---|---|---|
| 5,930,271 A | * | 7/1999 | Takahashi | 714/738 |
| 6,249,891 B1 | * | 6/2001 | Matsumura et al. | 714/738 |
| 6,308,292 B1 | * | 10/2001 | Fusco | 714/738 |
| 6,314,034 B1 | * | 11/2001 | Sugamori | 365/201 |
| 6,363,509 B1 | * | 3/2002 | Parulkar et al. | 714/738 |
| 6,536,006 B1 | * | 3/2003 | Sugamori | 714/724 |
| 6,557,128 B1 | * | 4/2003 | Turnquist | 714/724 |

* cited by examiner

*Primary Examiner*—Albert Decady
*Assistant Examiner*—Esaw Abraham
(74) *Attorney, Agent, or Firm*—Muramatsu & Associates (57) ABSTRACT

A test pattern converter for converting a test pattern in a cycle format to a test pattern in an event format. The test pattern converter includes a pattern controller for reading pattern count data to specify a test cycle and timing set data, a cycle generator for reading a value of the time length of the test cycle, a pattern data generator for reading a logic value of a test pattern waveform, a waveform data generator for reading format data indicating a type of the test pattern waveform and timing data indicating a delay time of a edge of the test pattern waveform from a start point of the test cycle, and a calculation unit for forming the test pattern in the event format based on the data from the pattern data generator and from the waveform data generator.

7 Claims, 8 Drawing Sheets

| Pin No. \ Pattern No. | 1 | 2 | 3 | 4 | ... | n |
|---|---|---|---|---|---|---|
| P1 | 1 | 1 | 1 | 0 | ... | ... |
| P2 | 1 | 0 | 0 | 0 | ... | ... |
| P3 | H | H | L | L | ... | ... |
| P4 | 0 | 1 | 1 | 1 | ... | ... |

Fig. 3H

| Pin No. \ Timing Format | | TS1 | TS2 | TS3 |
|---|---|---|---|---|
| P1 | RZ | T1 = 50ns<br>T2 = 80ns | T1 = 100ns<br>T2 = 150ns | T1 = 10ns<br>T2 = 30ns |
| P2 | NRZ | T1 = 80ns | T2 = 140ns | T1 = 0ns |
| P3 | STRB | T3 = 50ns | T3 = 120ns | T3 = 50ns |
| P4 | RZ | T1 = 50ns<br>T2 = 80ns | T1 = 80ns<br>T2 = 120ns | T1 = 20ns<br>T2 = 60ns |

| Pin No. / Event No. | P1 | P2 | P3 | P4 |
|---|---|---|---|---|
| e1 | 0ns : 0 | 0ns : 0 | 0ns | 0ns : 0 |
| e2 | 50ns : 1 | 80ns : 1 | 50ns : expH | 180ns : 1 |
| e3 | 80ns : 0 | 240ns : 0 | 220ns : expH | 220ns : 0 |
| e4 | 200ns : 1 | | 350ns : expL | 320ns : 1 |
| e5 | 250ns : 0 | | 440ns : expL | 360ns : 0 |
| e6 | 310ns : 1 | | | 430ns : 1 |
| e7 | 330ns : 0 | | | 460ns : 0 |

| Pattern Count | 1 | 2 | 3 | 4 | ... | n |
|---|---|---|---|---|---|---|
| Timing Set (TS) | TS1 | TS2 | TS3 | TS1 | ... | ... |

Fig. 6B

| Timing Set (TS) | TS1 | TS2 | TS3 | TS4 | ... | TSn |
|---|---|---|---|---|---|---|
| Cycle | 100ns | 200ns | 80ns | 150ns | ... | 300ns |

Fig. 6C

| Pattern Count | 1 | 2 | 3 | 4 | ... | n |
|---|---|---|---|---|---|---|
| Pattern Data | 1 | 1 | 1 | 0 | ... | ... |

Fig. 6D

| Timing Set (TS) | TS1 | TS2 | TS3 |
|---|---|---|---|
| Format | RZ | RZ | RZ |
| Timing | T1 = 50ns<br>T2 = 80ns | T1 = 100ns<br>T2 = 150ns | T1 = 10ns<br>T2 = 30ns |

Fig. 7

TEST PATTERN CONVERSION APPARATUS AND CONVERSION METHOD

FIELD OF THE INVENTION

This invention relates to a test pattern converter and conversion method thereof for converting the format of test patterns used to test semiconductor devices such as LSIs, and more particularly, to a test pattern converter and conversion method thereof for converting cycle-based test patterns into event-based test patterns with use of a tester simulator.

BACKGROUND OF THE INVENTION

In testing semiconductor devices such as LSIs, a semiconductor test system provides input test signals to a semiconductor device under test. The output signal from the semiconductor device under test resulting from the input test signal is sampled at timings of strobes, and compared with predetermined expected values to check if the two signals match with one another, thereby determining whether the semiconductor device under test functions correctly. Generally, the input test signal and strobe are collectively called a "test pattern".

Many different test patterns are produced depending on particular test types or test purposes for semiconductor devices to be tested, and are stored in a storage medium such as a hard disc as test pattern files. Prior to beginning a test for semiconductor devices, the applicable test patterns are installed in the semiconductor test system, where the test patterns are generated upon starting the test operation and the test patterns are applied to the semiconductor device under test.

The majority of the existing semiconductor test systems today are structured to generate test patterns using test pattern data described in a cycle format (hereafter "cycle-based test system"). The cycle format is a method of formulating pattern data in which the test patterns such as input test signals to be generated by the semiconductor test system are divided into each predetermined time (test cycle), and defining the kinds of waveforms, logic, and timings with respect to those test cycles. The details of the cycle format will be explained later.

Recently, an event-based semiconductor test system (hereafter "event-based test system") structured by an architecture different from the cycle-based test system has been proposed. The event-based test system generates test patterns by using the test pattern data described in an event format. The event format expresses the test pattern waveforms to be generated by the semiconductor test system by each and every change point (i.e., rising edges, falling edges) of the waveforms and its timing data. Therefore, processes such as dividing the test patterns at every test cycle are not involved in this format. The details of the event format will be explained later.

In the case of using the cycle format, test program descriptions become complicated and the execution of the test program will require a complicated test system operation, although the amount of data in the test program becomes small. On the contrary, in the case of using the event format, the test program description and its execution are more simplified, and the flexibility of the test system becomes greater. However, the amount of data in the event-based test patterns can increase, therefore requiring a larger memory capacity in the test system which increases the test system cost. In recent years, however, memory capacity per unit price has been dramatically increasing, thus, the cost increase of memories is no longer thought to be a major problem.

Figure 1:
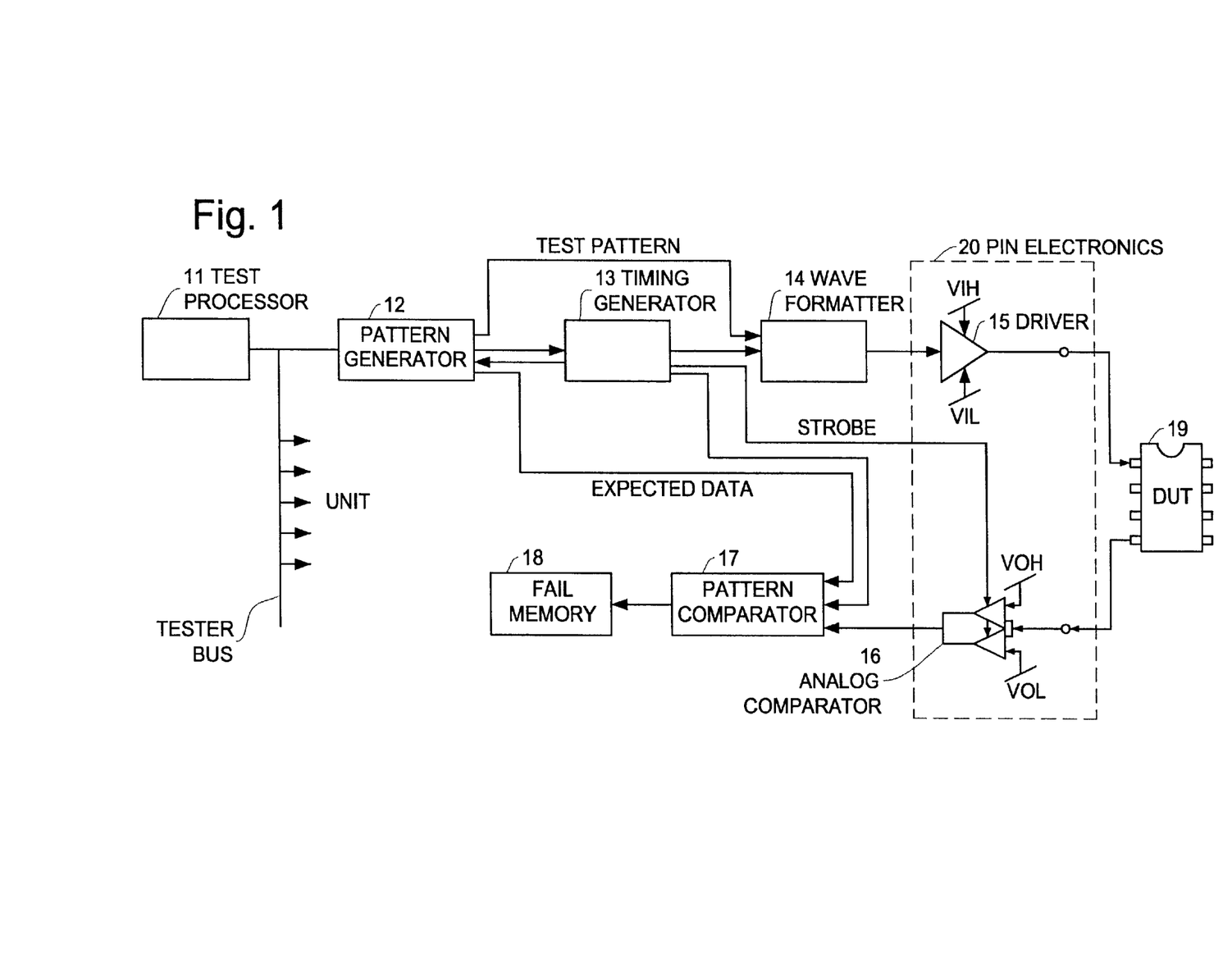
FIG. 1 is a block diagram showing an example of the basic structure of a semiconductor test system which is a cycle-based test system currently used today.

FIG. 1 is a block diagram showing an example of a basic structure of the cycle-based test system. In this diagram, a tester processor 11 is an exclusive processor installed in the test system, and controls the operation of the test system through a tester bus. Based on pattern data from the tester processor 11, a pattern generator 12 provides timing data and waveform data to a timing generator 13 and a wave formatter 14, respectively. Based on the waveform data from the pattern generator 12 and the timing data from the timing generator 13, the wave formatter 14 formats the test patterns. The test patterns produced by the wave formatter 14 are then supplied to a device under test (DUT) 19 through a driver 15 provided in a pin electronics circuit 20.

DUT 19 responds to the test patterns and generates output signals. The output signals are transmitted to an analog comparator 16 in the pin electronics circuit 20. At timings of the strobes, the analog comparator 16 converts the output signals from DUT 19 into logic signals with respect to predetermined threshold levels, and sends the result to a logic comparator 17. In the logic comparator 17, the logic data from DUT 19 and expected logic data formed by the pattern generator 12 are compared with each other. The results of comparison are stored in a failure memory 18 in the addresses corresponding to the addresses of a memory which stores the test patterns or to the addresses of DUT 19.

Figure 2:
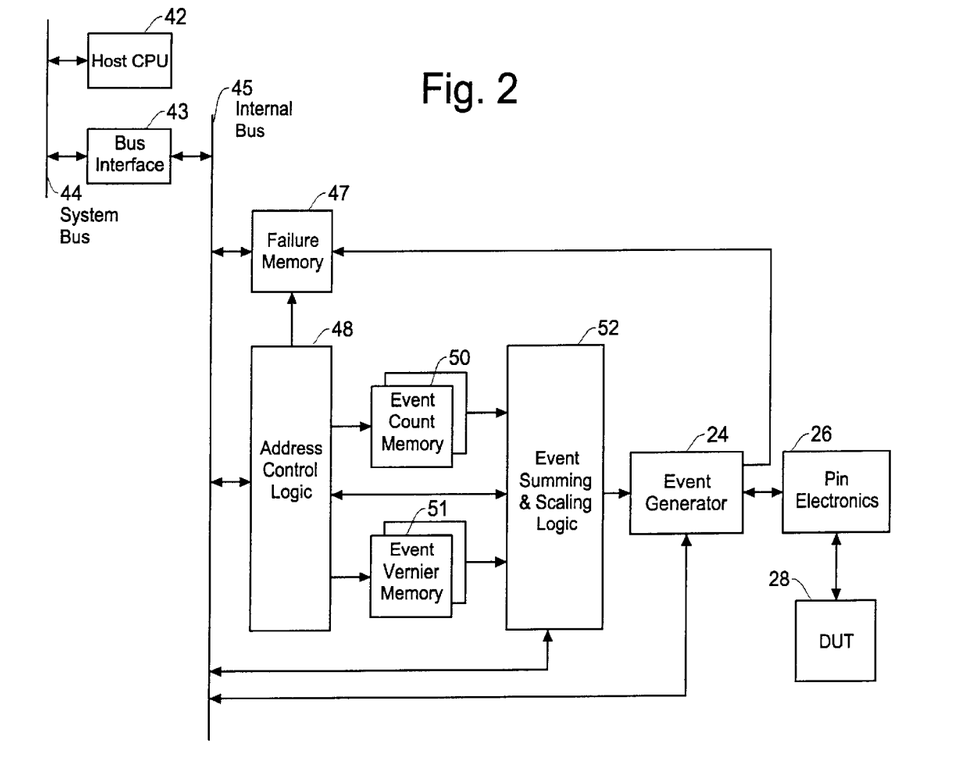
FIG. 2 is a block diagram showing an example of the basic structure of a newly proposed semiconductor test system which is an event-based test system.

FIG. 2 is a block diagram showing an example of a basic structure of the event-based test system. The event-based test system in this example is comprised of a host computer 42, a bus interface 43, an internal bus 45, an address control logic 48, a failure memory 47, an event memory configured by an event count memory 50 and an event vernier memory 51, an event summing and scaling logic 52, an event generator 24, and a pin electronics circuit 26. A device under test (DUT) 28 is connected to the pin electronics circuit 26.

As an example, the host computer 42 is a work station with a UNIX operating system. The host computer 42 functions as a user interface for the user to instruct the start and stop of the test, to load test programs and other test conditions, or to conduct the test result analysis at the host computer. The host computer 42 interfaces with the hardware test system through the system bus 44 and the bus interface 43.

The internal bus 45 is a bus within the hardware test system. As an example, the address control logic 48 is a tester processor exclusive to the hardware test system, and therefore the user cannot have access to it. Based on the test programs and test conditions from the host computer 42, the address control logic 48 supplies the instructions to other functional blocks within the test system. The failure memory 47 stores the test result such as failure information concerning the DUT 28 in the addresses defined by the address control logic 48. The information stored in the failure memory 47 is used in a failure analysis stage of the device under test.

The address control logic 48 provides the address data to the failure memory 47 and the event memory comprised of the event count memory 50 and the event vernier memory 51. The event memory stores the event timing data which expresses the timing of each event (i.e., change point of 1 to 0 or 0 to 1). For example, the timing data for each event is divided into integral data representing an integer multiple of a reference clock period and fractional data representing a fraction of the reference clock period. For example, the integral data is stored in the event count memory 50 and the fractional data is stored in the event vernier memory 51.

The event summing and scaling logic 52 accumulates the event timing data and modifies a multiplication ratio of the timing data, and expresses the timing of each event as a total timing (delay time) from a predetermined reference time. Based on the total timing data, the event generator 24 generates a test pattern (drive event), and provides the test pattern to DUT 28 through the pin electronics circuit 26. By comparing the response output signals of DUT 28 with the expected pattern (sampling event), the test system determines pass/fail regarding a particular pin of DUT 28.

As explained above, in the event-based test system, the data configuration in a test program used therein is simple, and therefore, allows the test program to be easily created as well as enables the test system to configure in such a way that each test pin in the test system functions independently from one another. As a result, the test system is able to perform with high flexibility. Based on such advantages, the event-based test system will be widely used in the near future.

The semiconductor test systems currently in practical use today operate with test programs using the cycle-based test patterns. Therefore, test system users have resources of many test pattern files described in the cycle-based format. If such assets of test patterns can be converted into an event-based format, then with the implementation of the event-based tester, the time and cost to create new test programs can be saved. What is needed is a pattern converter which can easily convert the existing cycle-based test patterns into event-based test patterns.

SUMMARY OF THE INVENTION

Therefore, it is an object of the present invention to provide a test pattern converter and a test pattern conversion method for converting the test pattern data created for the cycle-based test system into event-based test pattern data to be used in the event-based test system.

It is another object of the present invention to provide a test pattern converter for converting the cycle-based test pattern data into an event-based test pattern data with use of a tester simulator.

It is a further object of the present invention to provide a test pattern converter for effectively utilizing the existing test pattern resources by converting the test pattern data in the cycle format into test pattern data in the event format.

The test pattern converter of the present invention includes a pattern controller for sequentially reading out pattern count data indicating a pattern number assigned to specify a test cycle in a test pattern described in the cycle format and timing set data specifying a type of time length of the test cycle indicated by the pattern number; a cycle generator for reading out, based on the timing set data from the pattern controller, a value of the time length of the test cycle corresponding to the pattern number; a pattern data generator for reading out, based on the pattern count data from the pattern controller, a logic value (pattern data) of a test pattern waveform corresponding to the pattern number; a waveform data generator for reading out, based on the timing set data from the pattern controller, format data indicating a type of the test pattern waveform in the test cycle corresponding to the timing set data and timing data indicating a delay time of a rising edge or a falling edge of the test pattern waveform from a start point of the test cycle; and a calculation unit for forming the test pattern in the event format based on the data from the pattern data generator and from the waveform data generator wherein the event format test pattern describes the events by combinations of change points of the test waveform and time differences of the change points from a reference point.

The calculation unit accumulates all of time lengths of the timing set data corresponding to all of pattern numbers previous to the current pattern number and adds a delay time of a rising edge or a falling edge of the test pattern waveform of the current pattern number to the accumulated value, thereby determining an overall delay time of the rising or falling edge (current event) relative to the reference point.

The test pattern data formed by the calculation unit is stored in a storage medium, thereby producing a test pattern file of an event format. The description of the test pattern in the event format does not include information for dividing the test pattern on a time axis.

Another aspect of the present invention is a method of converting test pattern data described in a cycle format for testing a semiconductor device to test pattern data in an event format. The method includes the following steps of: sequentially reading out pattern count data indicating a pattern number assigned to specify a test cycle in a test pattern described in the cycle format and timing set data specifying a type of time length of the test cycle indicated by the pattern number; reading out a value of the time length of the test cycle corresponding to the pattern number based on the timing set data from the pattern controller; reading out a logic value (pattern data) of a test pattern waveform corresponding to the pattern number based on the pattern count data from the pattern controller; reading out format data indicating a type of the test pattern waveform in the test cycle corresponding to the timing set data and timing data indicating a delay time of a rising edge or a falling edge of the test pattern waveform from a start point of the test cycle based on the timing set data from the pattern controller; and forming the test pattern in the event format based on the data from the pattern data generator and from the waveform data generator wherein the event format test pattern describes the events by combinations of change points of the test waveform and time differences of the change points from a reference point.

With use of the test pattern converter of the present invention, the test pattern data already in a cycle-based format can be easily converted into an event-based format. Therefore, the test pattern assets created for the cycle-based test systems can be effectively utilized for event-based test systems, and the time and cost for newly creating event-based test patterns are saved, achieving the reduction in the overall test cost.

DETAILED DESCRIPTION OF THE INVENTION

In order to facilitate better understanding of the present invention, the data description in cycle-based test pattern data and the data description of event-based test pattern data will be explained with reference to the accompanying drawings. FIGS. 3A–3H shows the cycle-based test pattern waveforms and the data structure for generating these test pattern waveforms. FIGS. 3A, 3B, 3C, and 3D show the test pattern waveforms generated from test pins (corresponding to I/O pins of the device under test) P1, P2, P3, and P4, respectively, of the test system.

In the cycle-based format, in order to be generated, the test patterns are divided by predetermined time intervals (test cycle lengths) and assigned with pattern (test cycle) numbers. In this example, the test patterns are divided into four (4) cycles as designated by pattern numbers 1–4, although in an actual semiconductor device test, a very large number of cycles are used. To each of the test cycles, a timing set TS is assigned for expressing the predetermined time length of the test cycle. In this example, a timing set TS1 of 100 ns (nanoseconds), a timing set TS2 of 200 ns, and a timing set TS3 of 80 ns are respectively used. An actual test system incorporates, for example, 16 or 32 timing sets.

Figure 3A:
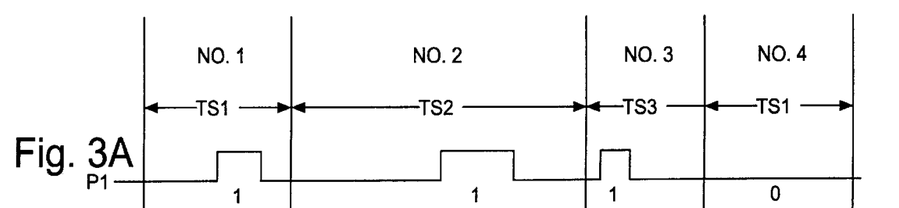
FIGS. 3A–3H are schematic diagrams showing an example of test pattern waveforms and test pattern data used for producing these test pattern waveforms in the cycle-based test system.
Figure 3B:
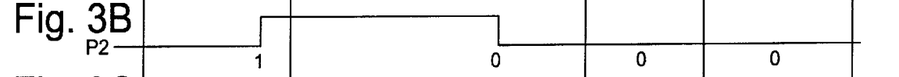
Figure 3C:
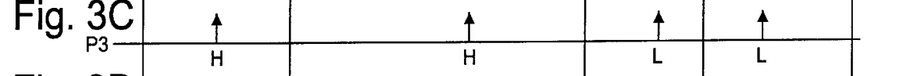
Figure 3D:
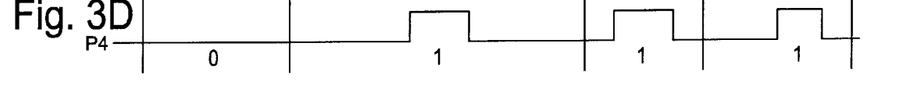
Figure 3E:
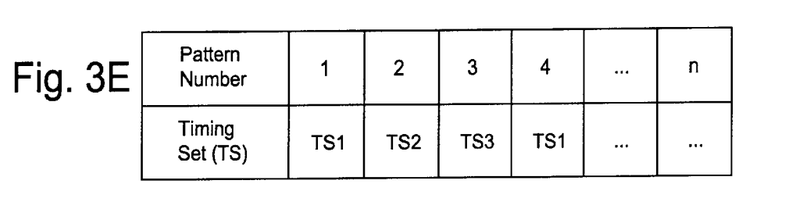
Figure 3F:
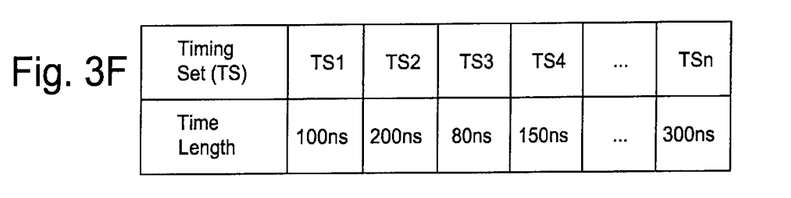
Figure 3G:
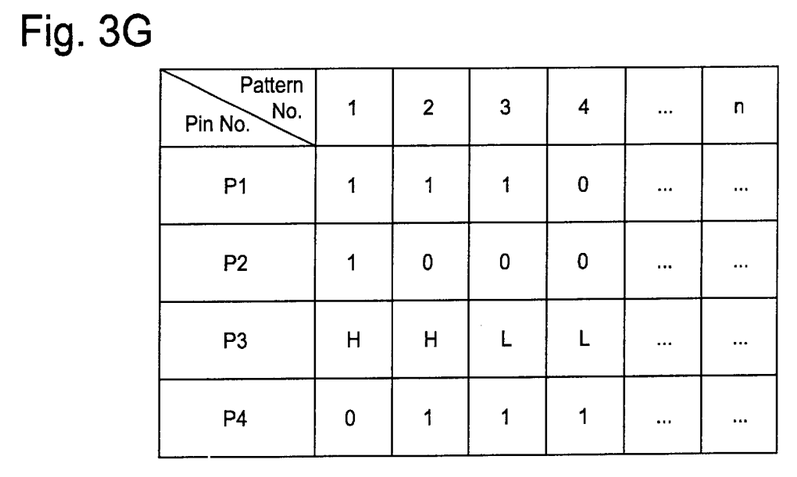

In order to generate the waveforms shown in FIGS. 3A, 3B, 3C, and 3D, the data shown in FIGS. 3E, 3F, 3G, and 3H are respectively created. FIG. 3E shows data expressing the relationship between the pattern numbers and the kinds of timing set relative to each test cycle divided as mentioned above. FIG. 3F shows data expressing the time intervals (test cycle length) of each timing set TS. FIG. 3G shows pattern data expressing the test pattern values (logic 1 or 0) of each pattern number (test cycle) for each test pin.

Figure 3H:
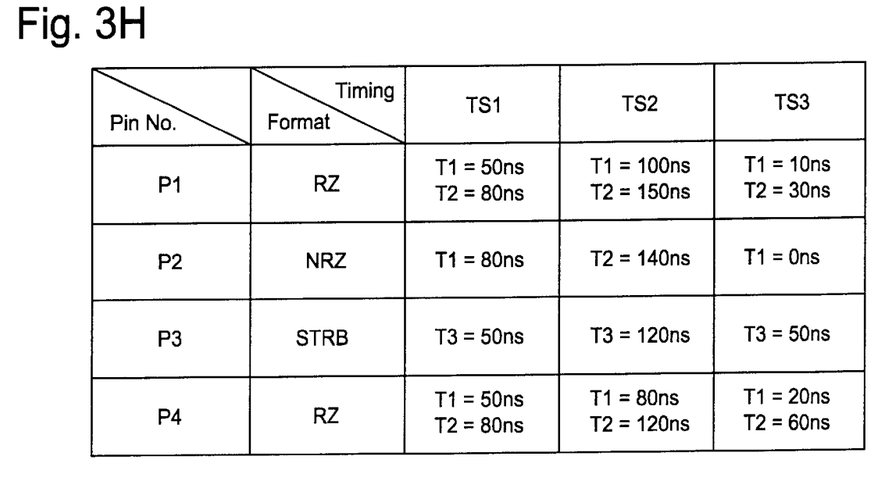

Further, FIG. 3H shows data expressing the waveform types and waveform timings in each pattern number. The waveform type data defines a waveform of the test pattern to be generated by selecting a type of waveform out of predetermined waveform types such as RZ (return zero) and NRZ (non-return zero) waveforms. The waveform timing data expresses a delay time from the start point of each test cycle (timing set), for example, a timing of the rising edge as T1 and a timing of the falling edge as T2 of the test cycle waveforms.

Therefore, the cycle-based test system has to use a plurality of different types of data shown in FIGS. 3E, 3F, 3G, and 3H for producing the test patterns shown in FIGS. 3A, 3B, 3C, and 3D, and then supplies the test patterns to the device under test. In the cycle-based format, although various types of data have to be used, because each data is defined only by the relationship with the corresponding test cycle, an overall data capacity can be kept small.

FIGS. 4A–4D show event-based test pattern waveforms which are basically the same as the cycle-based test pattern waveforms of FIGS. 3A–3D. In the event-based format, unlike the case of the cycle-based format noted above, the test patterns are not divided into test cycles and thus there is no assignment of timing sets to test cycles. Thus, each test pattern of test pins P1–P4 defines the change points of a signal as events, such as rising edges and falling edges, which are described by the timings (such as time differences from the reference point).

Figure 4A:
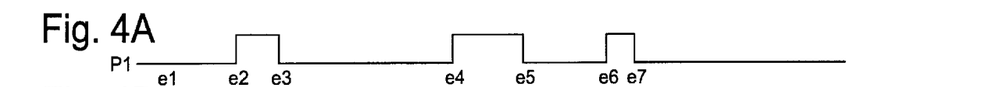
FIGS. 4A–4D are timing charts showing the test pattern waveforms corresponding to the waveforms in FIG. 3.
Figure 4B:
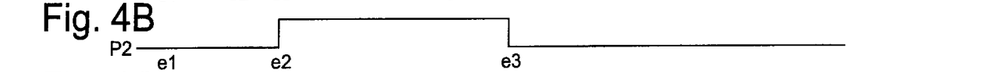
Figure 4C:
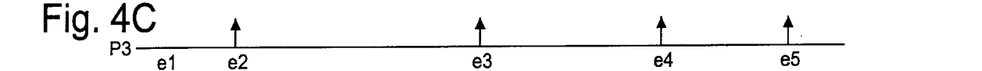
Figure 4D:
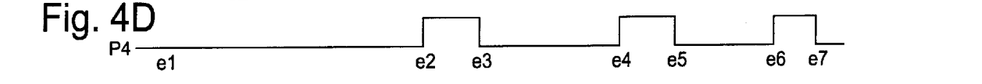
Figure 4E:
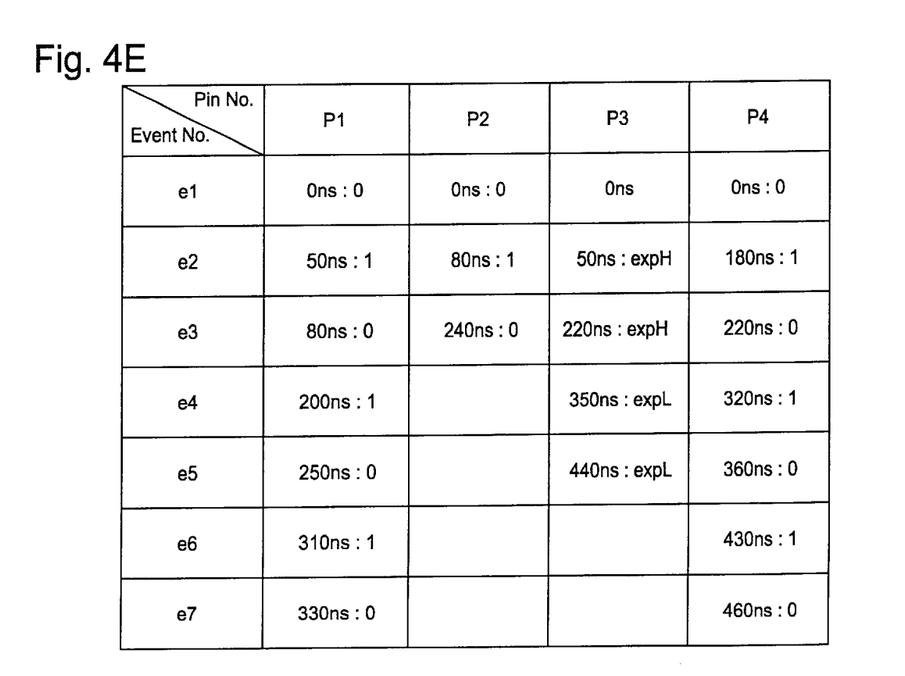
FIG. 4E is a schematic diagram showing an example of test pattern data used in the event-based test system for producing these waveforms.

For example, with respect to the test pattern of the test pin P1 shown in FIG. 4A, the start point and each of the change points of the waveform are defined as event numbers e1–e7. Under this situation, as shown in FIG. 4E, the event data expressing the waveform of the tester pin P1 is structured by the event numbers, their timings, and the types of event (such as rising edge or falling edge). Here, the timing of event can be described either as a time difference showing an absolute value from a reference time such as a start point or a time difference from the last event. Although expressing the timing as the time difference from the last event will allow the necessary data capacity to be smaller, a computation process will be required in order to determine the time difference as the absolute value.

Figure 5:
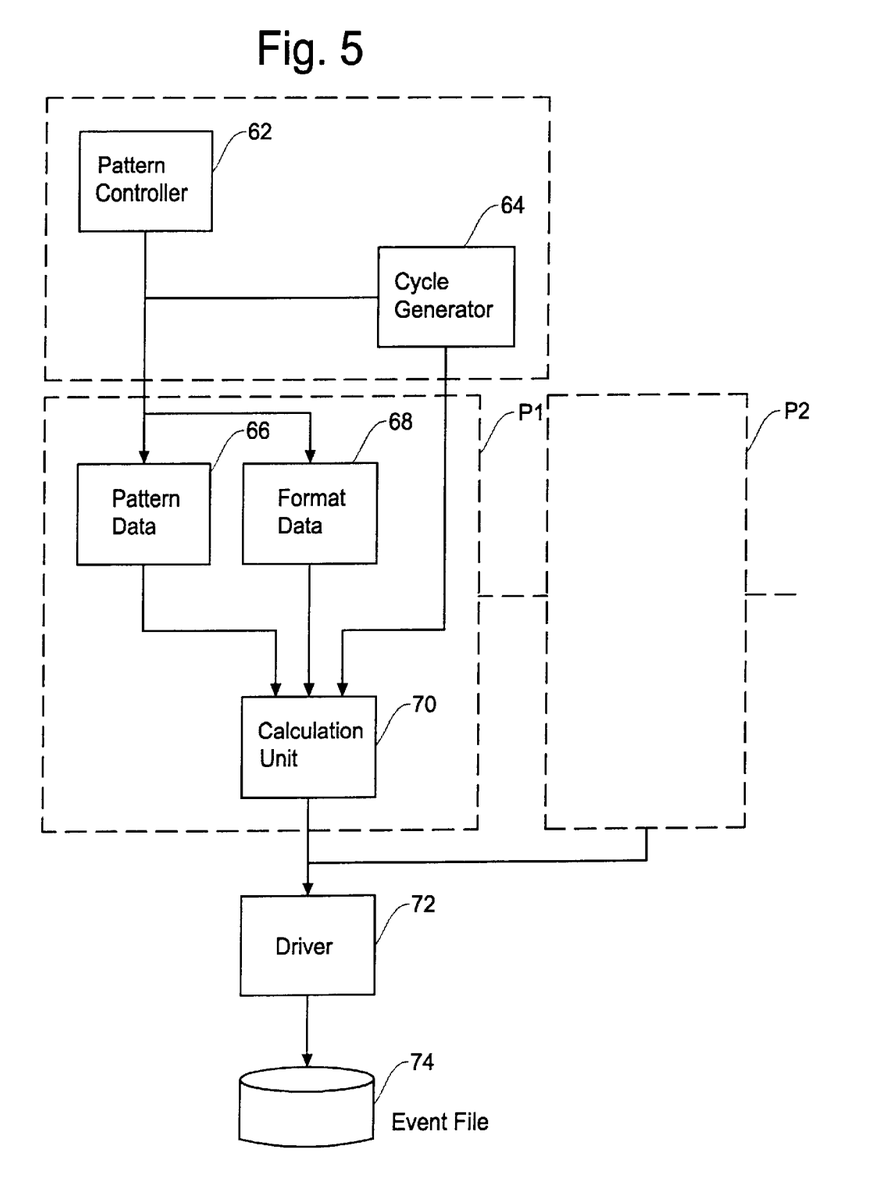
FIG. 5 is a block diagram showing a structural example of the test pattern converter of the present invention for converting the cycle-based test pattern data to the event-based test pattern data.

The block diagram shown in FIG. 5 presents a structural example of the pattern converter of the present invention for converting the test patterns described in the cycle-based format to test patterns described in the event-based format. This configuration performs a function similar to that of the test system using the cycle-based test patterns. Therefore, the pattern converter of the present invention has a function of a tester simulator. This tester simulator is a model having a data structure which is abstraction of the semiconductor test system. Hence, the pattern converter is structured by a simply operational model without having a structure required for a specific performance, such as a pipeline or interleave structure for high speed operations.

This pattern converter is comprised of a pattern controller 62, a cycle generator 64, a pattern data generator 66, a waveform data generator 68, and a calculation unit 70. A driver 72 is provided, for example, at the output of the pattern converter, to send the test patterns converted into the event-based format to a storage medium in order to create an event file 74. The pattern controller 62 and the cycle generator 64 are commonly provided and used by all of the test pins, while a set of the pattern data generator 66, the waveform data generator 68, and the calculation unit 70 is separately established for each test pin.

The pattern controller 62 counts a clock signal with a predetermined rate, and reads the pattern number (pattern count) data specified for each cycle (test cycle) and the timing set TS assigned to that pattern number. The pattern controller 62 then provides the timing set TS to the cycle generator 64, and reads the cycle time length defined by the timing set TS. The data indicating the cycle time length is sent to the calculation unit 70. Also, the pattern controller 62 provides the timing set TS to the waveform data generator 68, and reads the data regarding the type of waveform and delay times of the rising and falling edges corresponding to the timing set TS. Further, the pattern number data from the pattern controller 62 is provided to the pattern data generator 66, whereby reading the pattern data corresponding to the pattern number as to whether the waveform is logic "1" or "0".

The various kinds of data that have been read noted above are provided to the calculation unit 70. The calculation unit 70 uses the data, and creates event-based data by forming the change points and their timing data of the test pattern waveform. In the case where the description of the timing data in the event-based form data is made by using absolute time differences from the start point (reference point), the process of calculation is conducted as follows.

In order to determine the time length of a signal change point (event) of a certain pattern number, each and every time length of the timing set in the pattern number prior to the current pattern number is accumulated. Next, by adding the delay time corresponding to the change point (current event) to the accumulated time length (all of previous events), the time difference from the start point to the current event can be obtained. Based on the pattern data, the existence of the waveform is determined at the test cycle for that pattern number, and if it does exist, then the type of event is determined as well from the waveform type data.

As a more specific example, the following description is made for the case where the test pattern waveform of test pin P1 of FIG. 4A is converted to the data described in an event-based format of FIG. 4E by using the data of described in the cycle-based format as shown in FIGS. 3E, 3F, 3G, and 3H to generate the test pattern waveform of FIG. 3A for the tester pin P1.

Figure 6A:
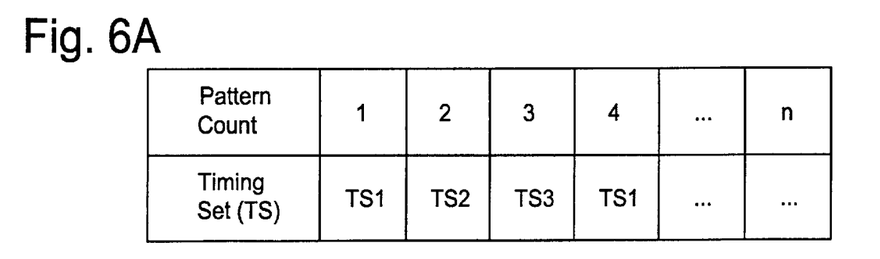
FIG. 6 is a schematic diagram showing examples of data implemented in each block of the test pattern converter of the present invention of FIG. 5.

The pattern controller 62 receives the data described in a manner shown in FIG. 6A which corresponds to FIG. 3E and is part of the cycle-based data. By counting the pattern numbers, pattern count (pattern number) data and timing set data corresponding to this pattern count data are sequentially read, such as a pattern 1 and a timing set TS1, and a pattern 2 and a timing set TS2. Each of such data is sent to the cycle generator 64, the pattern generator 66, and the waveform data generator 68, respectively.

Figure 6B:
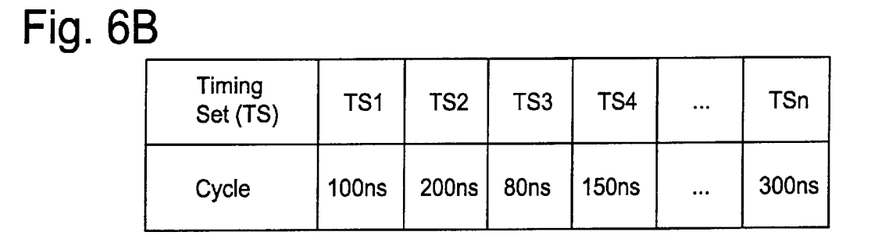

In the cycle generator 64, the data corresponding to FIG. 3F which is part of the cycle-based data is provided thereto which is described as shown in FIG. 6B. Based on the timing set data from the pattern controller 62, time length data of the applicable timing set is read from the cycle generator 64 and is transferred to the calculation unit 70. The data for the pattern controller 62 and the data for the cycle generator 64 are commonly used for all of the test pins P1, P2, . . . and Pn.

Figure 6C:
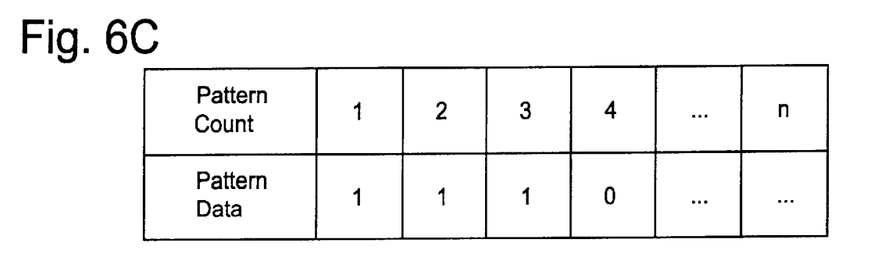

In the pattern data generator 66, the data corresponding to FIG. 3G, which is part of the cycle-based data, is provided thereto which is described as shown in FIG. 6C. Based on the pattern count data from the pattern controller 62, pattern data ("1" or "0") corresponding to the pattern number (pattern count data) is read and is provided to the calculation unit 70. Here, when the pattern data is "1", it indicates that a waveform exists in the corresponding pattern number, and when the pattern data is "0", it indicates that a waveform does not exist for the pattern number.

Figure 6D:
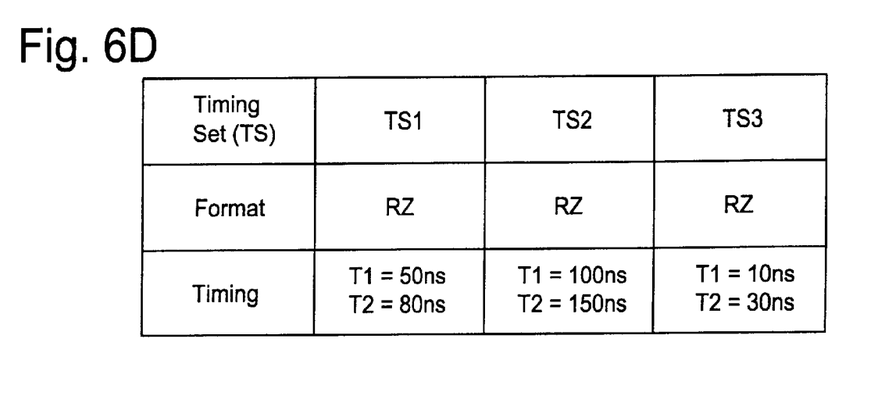

In the waveform data generator 68, the data corresponding to FIG. 3H, which is part of the cycle-based data, is provided thereto which is described as shown in FIG. 6D. Based on the timing set data from the pattern controller 62, data showing the waveform types (formats such as return-to-zero RZ or non-return-to-zero NRZ) for the corresponding timing set and data showing delay times of the timing set from the start point to a rising edge and/or a falling edge are read and are provided to the calculation unit 70. In FIG. 6D, for example, T1 indicates the rising edge and T2 indicates the falling edge. The data for the pattern data generator 66 and the data for the waveform data generator 68 are separately made for each test pin.

Figure 7:
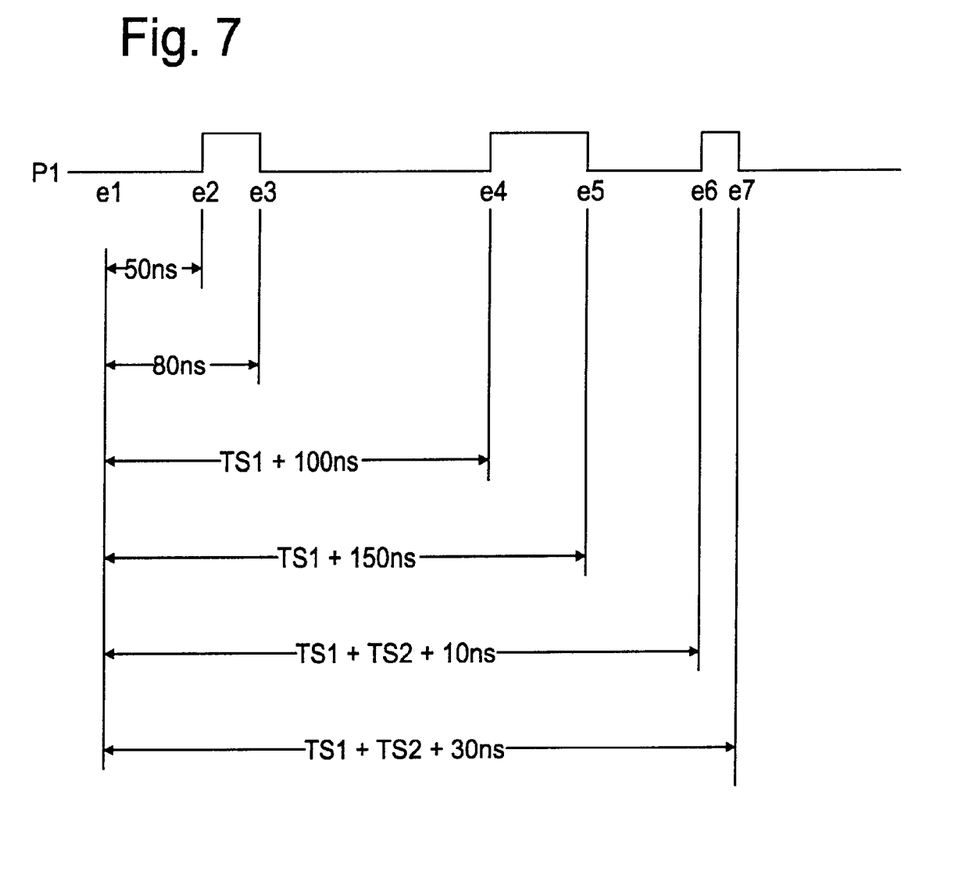
FIG. 7 is a waveform diagram explaining the process of converting the cycle-based test pattern data to the event-based test pattern data in accordance with the present invention.

The calculation unit 70 receives various cycle-based data as mentioned above, conducts an arithmetic operation for the data, and converts the data to event-based data. This operation will be explained with reference to respective data in FIGS. 6A, 6B, 6C, and 6D and the waveform in FIG. 7. The start point (reference point) of timing set TS1 of the pattern count 1 is defined to be the event 1 (e1), and its time is defined to be 0 (reference point time). Since the pattern data in FIG. 6C is "1", it is known that a waveform will be generated (an event exists) for the pattern count 1. From the timing data in FIG. 6D, as to the event 2 (e2), which is the first edge, it is known that the time difference is T1=50 ns from the reference point. Similarly, as to the event 3 (e3), which is the next edge, it is known that the time difference is T2=80 ns from the reference point.

When the pattern count data is 2, since the pattern data in FIG. 6C is "1", it is known that a waveform will be generated (an event exists) for the pattern count 2. Based on the data in FIG. 6D, the event 4 (e4) is on a time point of a delay time of T1=100 ns from the start point of the timing set TS2. Thus, the sum of the previous timing set TS1 and the delay time 100 ns becomes the total time difference from the reference point. Similarly, the event 5 (e5), which is the next edge, is on a time point with a delay time of T2=150 ns from the start point of the timing set TS2. Thus, the sum of the previous timing set TS1 and the delay time 150 ns becomes the total time difference from the reference point.

When the pattern count data is 3, since the pattern data in FIG. 6C is "1", it is known that a waveform will be generated (an event exists) for the pattern count 3. In FIG. 6D, the event 6 (e6) is on a time point with a delay time of T1=10 ns from the start point of the timing set TS3. Thus, the sum of the previous timing sets TS1 and TS2 and the delay time 10 ns becomes the total time difference from the reference point. Similarly, the event 7 (e7), which is the next edge, is on a time point with a delay time of T2=30 ns from the start point of the timing set TS3. Thus, the sum of the previous timing events TS1 and TS2 and the delay time 30 ns becomes the total time difference from the reference point.

By applying the above mentioned process to the entire test pins and patterns, the cycle-based test patterns can be converted to the event-based test patterns. As explained above, the event-based data formed in such a manner is described as shown in the example of FIG. 4E. The event-based test pattern data formed in such a way passes through, for example, the driver 72, and is stored in the storage medium as the event file 74 (FIG. 5).

The above mentioned pattern converter can be fulfilled by describing the tester simulator with use of a hardware description language (HDL). Alternatively, the tester simulator can be described by a more general purpose programming languages such as a C language and a C++ language. Further, it is apparent that the pattern converter of the present invention can also be implemented by hardware.

With use of the test pattern converter of the present invention, the test pattern data already in a cycle-based format can be easily converted into an event-based format. Therefore, the test pattern assets created for the cycle-based test systems can be effectively utilized for event-based test systems, and the time and cost for newly creating event-based test patterns are saved, achieving the reduction in the overall test cost.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A test pattern converter for converting test pattern data described in a cycle format for testing a semiconductor device to test pattern data in an event format, comprising:

a pattern controller for sequentially reading out pattern count data indicating a pattern number assigned to specify a test cycle in a test pattern described in the cycle format and timing set data specifying a type of time length of the test cycle indicated by the pattern number;

a cycle generator for reading out, based on the timing set data from the pattern controller, a value of the time length of the test cycle corresponding to the pattern number;

a pattern data generator for reading out, based on the pattern count data from the pattern controller, a logic value (pattern data) of a test pattern waveform corresponding to the pattern number;

a waveform data generator for reading out, based on the timing set data from the pattern controller, format data indicating a type of the test pattern waveform in the test cycle corresponding to the timing set data and timing data indicating a delay time of a rising edge or a falling edge of the test pattern waveform from a start point of the test cycle; and a calculation unit for forming the test pattern in the event format based on the data from the pattern data generator and from the waveform data generator wherein the event format test pattern describes the events by combinations of change points of the test waveform and time differences of the change points from a reference point.

2. A test pattern converter as defined in claim 1, wherein the test pattern data formed by the calculation unit is stored in a storage medium.

3. A test pattern converter as defined in claim 1, data description in the test pattern in the event format does not include information for dividing the test pattern on a time axis.

4. A test pattern converter as defined in claim 1, wherein the calculation unit accumulates all of time lengths of the timing set data corresponding to all of pattern numbers previous to the current pattern number and adds a delay time of a rising edge or a falling edge of the test pattern waveform of the current pattern number to the accumulated value, thereby determining an overall delay time of the rising or falling edge (current event) relative to the reference point.

5. A method of converting test pattern data as defined in claim 1, further comprising a step of accumulating all of time lengths of the timing set data corresponding to all of pattern numbers previous to the current pattern number and a step of adding a delay time of a rising edge or a falling edge of the test pattern waveform of the current pattern number to the accumulated value, thereby determining an overall delay time of the rising or falling edge (current event) relative to the reference point.

6. A method of converting test pattern data described in a cycle format for testing a semiconductor device to test pattern data in an event format, comprising the following steps of:

sequentially reading out pattern count data indicating a pattern number assigned to specify a test cycle in a test pattern described in the cycle format and timing set data specifying a type of time length of the test cycle indicated by the pattern number;

reading out a value of the time length of the test cycle corresponding to the pattern number based on the timing set data from the pattern controller;

reading out a logic value (pattern data) of a test pattern waveform corresponding to the pattern number based on the pattern count data from the pattern controller;

reading out format data indicating a type of the test pattern waveform in the test cycle corresponding to the timing set data and timing data indicating a delay time of a rising edge or a falling edge of the test pattern waveform from a start point of the test cycle based on the timing set data from the pattern controller; and forming the test pattern in the event format based on the data from the pattern data generator and from the waveform data generator wherein the event format test pattern describes the events by combinations of change points of the test waveform and time differences of the change points from a reference point.

7. A method of converting test pattern data as defined in claim 6, data description in the test pattern in the event format does not include information for dividing the test pattern on a time axis.

* * * * *